United States Patent
Kim et al.

(10) Patent No.: US 8,319,217 B2
(45) Date of Patent: *Nov. 27, 2012

(54) OXIDE SEMICONDUCTOR THIN FILM TRANSISTOR, METHOD OF MANUFACTURING THE SAME, AND ORGANIC ELECTROLUMINESCENT DEVICE INCLUDING THE SAME

(75) Inventors: Kwang-Suk Kim, Yong (KR); Min-Kyu Kim, Yong (KR)

(73) Assignee: Samsung Display Co., Ltd. (KR)

( * ) Notice: Subject to any disclaimer, the term of this patent is extended or adjusted under 35 U.S.C. 154(b) by 218 days.

This patent is subject to a terminal disclaimer.

(21) Appl. No.: 12/873,199

(22) Filed: Aug. 31, 2010

(65) Prior Publication Data
US 2011/0140095 A1 Jun. 16, 2011

(30) Foreign Application Priority Data
Dec. 15, 2009 (KR) .................. 10-2009-0125032

(51) Int. Cl.
*H01L 29/12* (2006.01)

(52) U.S. Cl. ............... 257/43; 257/57; 257/E29.095; 257/E29.08; 438/104; 438/158

(58) Field of Classification Search ............ 257/E29.08
See application file for complete search history.

(56) References Cited

U.S. PATENT DOCUMENTS

| | | | |
|---|---|---|---|
| 2006/0108636 A1 | 5/2006 | Sano et al. | |
| 2008/0296568 A1 | 12/2008 | Ryu et al. | |
| 2008/0315200 A1* | 12/2008 | Kim et al. | 257/57 |
| 2009/0294764 A1* | 12/2009 | Kim et al. | 257/43 |
| 2010/0001346 A1* | 1/2010 | Ye | 257/347 |
| 2010/0025674 A1* | 2/2010 | Kim et al. | 257/43 |
| 2010/0051937 A1 | 3/2010 | Kaji et al. | |
| 2010/0276683 A1* | 11/2010 | Kim et al. | 257/43 |
| 2011/0114939 A1* | 5/2011 | Kim et al. | 257/43 |

FOREIGN PATENT DOCUMENTS

| | | |
|---|---|---|
| JP | 2008-218495 | 9/2008 |
| KR | 10-2008-0104860 A | 12/2008 |
| KR | 10-2009-0089482 A | 8/2009 |

OTHER PUBLICATIONS

Registration Determination Certificate issued by the Korean Intellectual Property Office dated Apr. 20, 2011, 5 pages.

* cited by examiner

*Primary Examiner* — Calvin Lee
*Assistant Examiner* — Scott Stowe
(74) *Attorney, Agent, or Firm* — Knobbe Martens Olson & Bear LLP

(57) ABSTRACT

A thin film transistor including: a substrate; a gate electrode formed on the substrate; a gate insulating layer formed on the gate electrode and exposed portions of the substrate; an oxide semiconductor layer formed on the gate insulating layer to correspond to the gate electrode, and comprising an HfIn-ZnO-based oxide semiconductor, wherein the oxide semiconductor layer has a Zn concentration gradient; and source and drain regions respectively formed on both sides of the oxide semiconductor layer and the gate insulating layer.

28 Claims, 7 Drawing Sheets

US 8,319,217 B2

OXIDE SEMICONDUCTOR THIN FILM TRANSISTOR, METHOD OF MANUFACTURING THE SAME, AND ORGANIC ELECTROLUMINESCENT DEVICE INCLUDING THE SAME

CROSS-REFERENCE TO RELATED APPLICATIONS

This application claims the benefit of Korean Patent Application No. 10-2009-0125032, filed on Dec. 15, 2009, in the Korean Intellectual Property Office, the disclosure of which is incorporated herein in its entirety by reference.

BACKGROUND

1. Field

The present embodiments relate to a thin film transistor, and more particularly, to a thin film transistor including an HfInZnO-based oxide semiconductor layer as a channel layer, a method of manufacturing the same, and an organic electroluminescent device including the same.

2. Description of the Related Technology

A thin film transistor (TFT) is a special type of a field effect transistor made by depositing thin films of a semiconductor material over an insulating supporting substrate. The TFT basically includes three terminals, e.g., a gate, a drain, and a source, and is mainly used as a switching device.

Currently, commercially available products, such as notebook computers, PC monitors, TVs, mobile devices, and the like mostly include amorphous silicon thin film transistors (a-Si TFTs). Amorphous silicon may be deposited over large areas and easily deposited at low temperatures onto a glass substrate, and thus is most widely used in TFTs. However, as the requirements for display devices with larger sizes and higher image quality have increased, high performance thin film transistors having higher electron mobility than a-Si TFTs, e.g., 0.5 to 1 $cm^2/Vs$, and appropriate manufacturing techniques have been required.

Polysilicon (poly-Si) TFTs have a mobility of several tens to hundreds of $cm^2/Vs$, and thus a data driving circuit or periphery circuit required for higher mobility may be embedded in a substrate. In addition, channels of such TFTs may be made short, and thus an aperture ratio of a screen may be high. Moreover, poly-Si TFTs may have high resolution, operate at low driving voltages, have low power consumption, and have less characteristic deterioration. However, a crystallization process used to manufacture poly-Si TFTs is complicated, and thus additional manufacturing costs may increase. In addition, due to technical problems such as manufacturing equipment limitations or uniformity defects, manufacturing of a large-scale substrate using poly-Si TFTs has not been realized up to date.

Oxide semiconductor devices have advantages of both TFTs and poly-Si TFTs. The oxide semiconductor devices may be manufactured at a low temperature, easily be made in large sizes, and have high mobility and a excellent electric characteristics like the poly-Si TFT. Thus, research is currently being conducted in order to use an oxide semiconductor layer in a channel area of a TFT.

However, recent reports have disclosed that the characteristics of commonly used InGaZnO oxide semiconductor devices deteriorate when exposed to plasma or external agents (for example, moisture, oxygen, or the like). Also, to protect the oxide semiconductor layer, an etch stop layer is disposed on the oxide semiconductor layer. However, depending on the conditions for forming the etch stop layer, the characteristics of the oxide semiconductor devices may severely deteriorate. In addition, the condition ranges wherein the characteristics of the oxide semiconductor devices do not deteriorated are limited, and thus there is a need for fundamental changes in oxide semiconductor devices.

SUMMARY

The present embodiments provide an oxide semiconductor thin film transistor having enhanced electrical characteristic and stability, a method of manufacturing the same, and an organic electroluminescent device including the same.

According to an aspect of the present embodiments, there is provided a thin film transistor including: a substrate; a gate electrode formed on the substrate; a gate insulating layer formed on the gate electrode and exposed portions of the substrate; an oxide semiconductor layer formed on the gate insulating layer to correspond to the gate electrode, and including an HfInZnO-based oxide semiconductor, wherein the oxide semiconductor layer has a Zn concentration gradient; and source and drain regions respectively formed on both sides of the oxide semiconductor layer and the gate insulating layer.

According to another aspect of the present embodiments, there is provided a thin film transistor including: a substrate; a gate electrode formed on the substrate; a gate insulating layer formed on the gate electrode and exposed portions of the substrate; an oxide semiconductor layer formed on the gate insulating layer to correspond to the gate electrode, including a first layer formed on the gate insulating layer and a second layer formed on the first layer, and including an HfInZnO-based oxide semiconductor, wherein the concentration of Zn is higher in the second layer than in the first layer; and source and drain regions respectively formed on both sides of the oxide semiconductor layer and the gate insulating layer.

According to another aspect of the present embodiments, there is provided a method of manufacturing a thin film transistor, the method including: forming a gate electrode on a substrate; forming a gate insulating layer on the gate electrode and exposed portions of the substrate; forming an HfInZnO-based oxide semiconductor layer having a Zn concentration gradient on the gate insulating layer; and forming source and drain regions respectively extending on both sides of the oxide semiconductor layer and the gate insulating layer.

According to another aspect of the present embodiments, there is provided a method of manufacturing a thin film transistor, the method including: aiming a gate electrode on a substrate; forming a gate insulating layer on the gate electrode and exposed portions of the substrate; forming an HfInZnO-based oxide semiconductor layer including a first layer fanned on the gate insulating layer and a second layer formed on the first layer, wherein the concentration of Zn is higher in the second layer than in the first layer; and forming source and drain regions extending on both sides of the oxide semiconductor layer and the gate insulating layer.

BRIEF DESCRIPTION OF THE DRAWINGS

The above and other features and advantages of the present embodiments will become more apparent by describing in detail exemplary embodiments thereof with reference to the attached drawings in which.

DETAILED DESCRIPTION

The present embodiments will now be described more fully with reference to the accompanying drawings, in which exemplary embodiments are shown. The present embodiments may, however, be embodied in many different forms and should not be construed as being limited to the embodiments set forth herein; rather, these embodiments are provided so that this disclosure will be thorough and complete, and will fully convey the concept of the present embodiments to those skilled in the art.

The term "HfInZnO-based oxide semiconductor" used herein refers to an oxide semiconductor including hafnium (Hf), indium (In), zinc (Zn), and oxygen (O), wherein the composition ratio of Hf, In, Zn, and O may vary. In this specification, the concentration of Hf and Zn is represented by an atomic percentage (at %), and the total atomic percentage (at %) of Hf, In, and Zn is 100.

Figure 1:
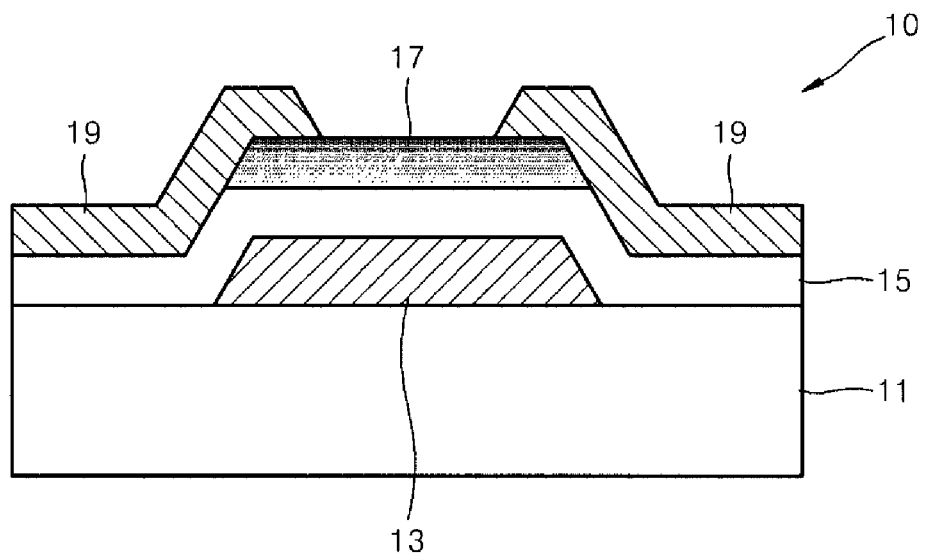
FIG. 1 is a cross-sectional view illustrating a structure of a thin film transistor including an oxide semiconductor layer, according to an embodiment.

FIG. 1 is a cross-sectional view illustrating a structure of an oxide semiconductor thin film transistor 10 including an oxide semiconductor layer, according to an embodiment.

Referring to FIG. 1, the oxide semiconductor thin film transistor 10 includes: a substrate 11; a gate electrode 13 formed on the substrate 11; a gate insulating layer 15 formed on the gate electrode 13 and exposed portions of the substrate 11; an oxide semiconductor layer 17 formed on the gate insulating layer 15 to correspond to the gate electrode 13; source and drain 19 that are respectively formed on both sides of the oxide semiconductor layer 17 and on exposed portions of the gate insulating layer 15 so as to expose a portion of a top surface of the oxide semiconductor layer 17 and respectively contact the both sides of the oxide semiconductor layer 17. The oxide semiconductor layer 17 functions as a channel layer. A buffer layer (not shown) may be optionally formed between the substrate 11 and the gate electrode 13 and between the substrate 11 and the gate insulating layer 15. In addition, an etch stop layer (not shown) may be optionally formed on the oxide semiconductor layer 17.

The substrate 11 may comprise, for example, silicon (Si), glass, or plastic. The gate electrode 13 may comprise, for example, a metal such as titanium (Ti), platinum (Pt), ruthenium (Ru), copper (Cu), gold (Au), silver (Ag), molybdenum (Mo), chromium (Cr), aluminum (Al), tantalum (Ta), tungsten (W), or alloys thereof, or a conductive oxide such as tin oxide, zinc oxide, indium oxide, indium thin oxide (ITO), indium zinc oxide (IZO), gallium zinc oxide (GZO), indium gallium oxide (IGO), or aluminum zinc oxide (AZO). For example, the gate electrode 13 may be any one of a single metal layer containing Cu or Mo, a multi-layered metal layer including a Mo-containing metal layer, a Ti-containing metal layer, and a Cr-containing metal layer.

The gate insulating layer 15 may comprise, for example, a dielectric material such as $SiO_2$, $SiN_x$, $SiON$, $HfO_2$, $Al_2O_3$, $Y_2O_3$, or $Ta_2O_5$, a high-K dielectric material, or mixtures thereof.

The oxide semiconductor layer 17 comprises an HfInZnO-based oxide semiconductor. The HfInZnO-based oxide semiconductor may be amorphous or crystalline. The concentration of Zn contained in the oxide semiconductor layer 17 may decrease towards a lower portion of the oxide semiconductor layer 17 contacting the gate insulating layer 15, and may increase towards an upper portion of the oxide semiconductor layer 17. Thus, the concentration of Zn may have a gradual gradient in the oxide semiconductor layer 17 comprising the HfInZnO-based oxide semiconductor. For example, the oxide semiconductor layer 17 may have a gradual Zn concentration gradient in such a way that an atomic ratio of Zn to In is smaller than 1 (Zn/In<1) in a lower portion of the oxide semiconductor layer 17, and an atomic ratio of Zn to In is greater than 1 (Zn/In>1) in an upper portion of the oxide semiconductor layer 17. The concentration of Zn in the oxide semiconductor layer 17 may be in from about 30 to about 70 at % (atomic percentage) based on 100 at % of the total concentration of Hf, In, and Zn. When Zn/In<1, Zn/In=1, and Zn/In>1, the concentration of Hf (atomic percentage) may be from about 5 to about 13 at %, from about 3 to about 10 at %, and from about 2 to about 10 at %, respectively, based on 100 at % of the total concentration of Hf, In, and Zn. When the concentrations of Zn and Hf are within the ranges described above, the thin film transistor comprising the HfInZnO-based oxide semiconductor may exhibit its characteristics as a transistor.

When the concentration of Zn in the HfInZnO-based oxide semiconductor increases, a structure of the HfInZnO-based oxide semiconductor becomes strong, thereby decreasing defect problems occurring when the HfInZnO-based oxide semiconductor is subjected to subsequent processes such as a thin film formation process or a plasma process. As a result, the stability of the thin film transistor increases. However, the electron mobility of the HfInZnO-based oxide semiconductor decreases, thereby reducing the electrical characteristics of the thin film transistor.

Therefore, the concentration of Zn in the oxide semiconductor layer 17 may decrease towards a portion of the oxide semiconductor layer 17 where a channel is formed, the portion contacting the gate insulating layer 15, thereby increasing the electron mobility of the HfInZnO-based oxide semiconductor to enhance the performance of the thin film transistor, and the concentration of Zn in the oxide semiconductor layer 17 may increase towards an upper portion of the oxide semiconductor layer 17 that is exposed to the surrounding circumstances, thereby increasing the stability of the thin film transistor.

The source and drain 19 may comprise, for example, the same material as that of the gate electrode 13, e.g., a metal such as Ti, Pt, Ru, Cu, Au, Ag, Mo, Cr, Al, Ta, W, or alloys thereof, or a conductive oxide such as tin oxide, zinc oxide, indium oxide, ITO (Indium Tin Oxide), IZO (Indium Zinc Oxide), GZO (gallium Zinc Oxide), IGO (Indium Gallium Oxide) or AZO (Aluminum Zinc Oxide). For example, the source and drain 19 may be any one of a single metal layer containing Cu or Mo, a multi-layered metal layer including a Mo-containing metal layer, a Ti-containing metal layer, and a Cr-containing metal layer.

Figure 2:
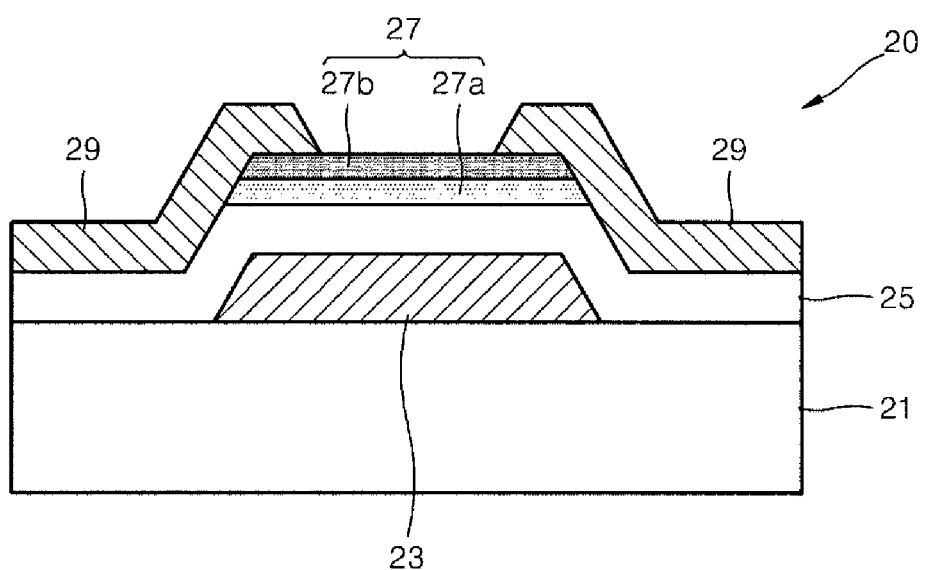
FIG. 2 is a cross-sectional view illustrating a structure of a thin film transistor including an oxide semiconductor layer, according to another embodiment.

FIG. 2 is a cross-sectional view illustrating a structure of an oxide semiconductor thin film transistor 20 including an oxide semiconductor layer, according to another embodiment. The oxide semiconductor thin film transistor 20 of FIG. 2 has the same structure as the oxide semiconductor thin film transistor 10 of FIG. 1, except that the oxide semiconductor thin film transistor 20 includes a double-layered oxide semiconductor layer.

Referring to FIG. 2, the oxide semiconductor thin film transistor 20 includes: a substrate 21, a gate electrode 23 formed on the substrate 21; a gate insulating layer 25 formed on the gate electrode 23 and exposed portions of the substrate 21; an oxide semiconductor layer 27 formed on the gate insulating layer 25 to correspond to the gate electrode 23; source and drain 29 that are respectively formed on both sides of the oxide semiconductor layer 27 and on exposed portions of the gate insulating layer 25 so as to expose a portion of a top surface of the oxide semiconductor layer 27 and respectively contact the both sides of the oxide semiconductor layer 27.

The oxide semiconductor layer 27 includes a first oxide semiconductor layer 27a formed on the gate insulating layer 25 and a second oxide semiconductor layer 27b formed on the first oxide semiconductor layer 27a. A buffer layer (not shown) may be optionally formed between the substrate 21 and the gate electrode 23 and between the substrate 21 and the gate insulating layer 25. In addition, an etch stop layer (not shown) may be optionally formed on be oxide semiconductor layer 27.

The substrate 21 may comprise, for example, Si, glass, or plastic. The gate electrode 23 may comprise, for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO. For example, the gate electrode 23 may be any one of a single metal layer containing Cu or Mo, a multi-layered metal layer including a Mo-containing metal layer, a Ti-containing metal layer, and a Cr-containing metal layer.

The gate insulating layer 25 may comprise, for example, a dielectric material such as $SiO_2$, $SiN_X$, SiON, $HfO_2$, $Al_2O_{3-}$, $Y_2O_3$, or $Ta_2O_5$, a high-K dielectric material, or mixtures thereof.

Each of the first oxide semiconductor layer 27a and the second oxide semiconductor layer 27b may comprise, for example, an HfInZnO-based oxide semiconductor, and the concentration of Zn may be lower in the first oxide semiconductor layer 27a than in the second oxide semiconductor layer 27b. For example, the first oxide semiconductor layer 27a and the second oxide semiconductor layer 27b may be formed in such a way that an atomic ratio of Zn to In is smaller than 1 (Zn/In<1) in the first oxide semiconductor layer 27a, and an atomic ratio of Zn to In is greater than 1 (Zn/In>1) in the second oxide semiconductor layer 27b. The concentration of Zn in the first oxide semiconductor layer 27a may be from about 30 to about 70 at % based on 100 at % of the total concentration of Hf, In, and Zn, and the concentration of Zn in the second oxide semiconductor layer 27b may be from about 35 to about 70 at % based on 100 at % of the total concentration of Hf, In, and Zn. When Zn/In<1, Zn/In=1, and Zn/In>1, the concentration of Hf (atomic percentage) may be from about 5 to about 13 at %, from about 3 to 10 at %, and from about 2 to about 10 at %, respectively, based on 100 at % of the total concentration of Hf, In, and Zn. The HfInZnO-based oxide semiconductor may be amorphous or crystalline.

In the present embodiment, the oxide semiconductor layer 27 is double-layered, but the oxide semiconductor layer 27 may also be three-layered. The concentration of Zn may be the lowest in a first oxide semiconductor layer formed right on the gate insulating layer 25, the concentration of Zn may be the highest in the third oxide semiconductor layer formed on the uppermost portion thereof, and the concentration of Zn may have a value between the highest and lowest values in the second oxide semiconductor layer formed therebetween.

The first oxide semiconductor layer 27a may act as a channel layer, and the second oxide semiconductor layer 27b may act as a channel layer and a protective layer for the first oxide semiconductor layer 27a. Thus, the deposition structure of the first oxide semiconductor layer 27a and the second oxide semiconductor layer 27b may prevent deterioration of the electrical characteristics of the thin film transistor and may also enhance the stability of the thin film transistor.

The source and drain 29 may comprise, for example, a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO. For example, the source and drain 29 may be any one of a single metal layer containing Cu or Mo, a multi-layered metal layer including a Mo-containing metal layer, a Ti-containing metal layer, and a Cr-containing metal layer.

FIGS. 3A through 3D are cross-sectional views sequentially illustrating a method of manufacturing a thin film transistor, according to an embodiment.

Figure 3A:
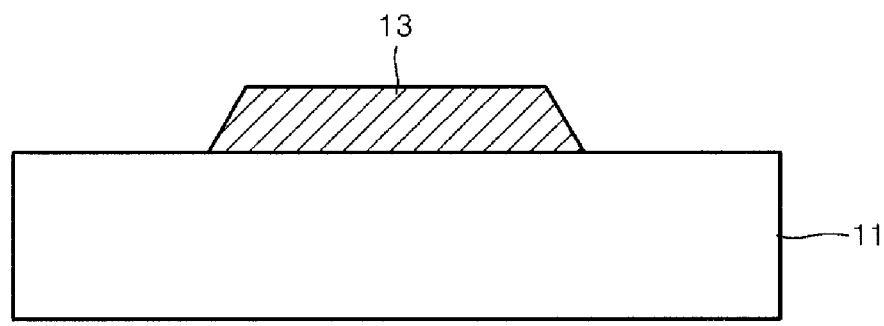
FIGS. 3A through 3D are cross-sectional views sequentially illustrating a method of manufacturing a thin film transistor, according to an embodiment.

Referring to FIG. 3A, the gate electrode 13 is formed on the substrate 11. The substrate 11 may comprise, for example, Si, glass, or plastic.

A conductive layer comprising a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the substrate 11, and patterned to form the gate electrode 13. Optionally, a buffer layer (not shown) may be formed on the substrate 11, and the gate electrode 13 may be then formed thereon.

Figure 3B:
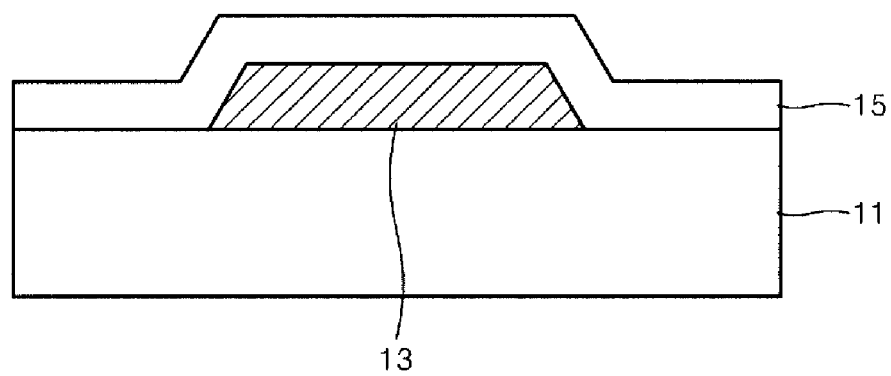

Referring to FIG. 3B, the gate insulating layer 15 is formed on the substrate 11 on which the gate electrode 13 is formed, wherein the gate insulating layer 15 comprises a dielectric material such as $SiO_2$, $SiN_X$, SiON, $HfO_2$, $Al_2O_3$, $Y_2O_3$, or $Ta_2O_5$, a high-K dielectric material, or mixtures thereof.

Figure 3C:
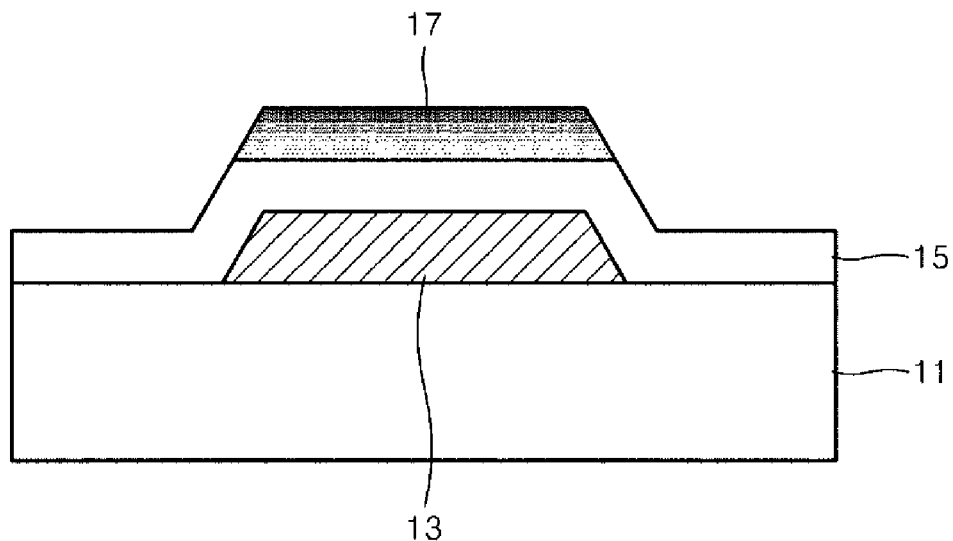

Referring to FIG. 3C, an HfInZnO-based oxide semiconductor layer is formed on the gate insulating layer 15, and is then patterned to form the oxide semiconductor layer 17. The oxide semiconductor layer 17 is formed to have a gradual Zn concentration gradient in such a way that the concentration of Zn increases towards an upper portion of the oxide semiconductor layer 17 away from a lower portion of the oxide semiconductor layer 17 that contacts the gate insulating layer 15.

The HfInZnO-based oxide semiconductor layer may be formed by co-sputtering by respectively applying powers to three targets of $HfO_2$, $In_2O_3$, and ZnO. The HfInZnO-based oxide semiconductor may be amorphous or crystalline. The oxide semiconductor layer 17 is formed to have a gradual Zn concentration gradient in such a way that by varying the voltages respectively applied to the three targets according to the sputtering time, the concentration of Zn increases towards an upper portion of the oxide semiconductor layer 17 away from a lower portion of the oxide semiconductor layer 17.

For example, the oxide semiconductor layer 17 may be formed to have a gradual Zn concentration gradient in such a way that an atomic ratio of Zn to In is smaller than 1 (Zn/In<1) on a lower portion of the oxide semiconductor layer 17, and an atomic ratio of Zn to In is greater than 1 (Zn/In>1) on an upper portion of the oxide semiconductor layer 17. The concentration of Zn in the oxide semiconductor layer 17 may be from about 30 to about 70 at % based on 100 at % of the total concentration of Hf, In, and Zn. When Zn/In<1, Zn/In=1, and Zn/In>1, the concentration of Hf (atomic percentage) may be from about 5 to about 13 at %, from about 3 to about 10 at %, and from about 2 to about 10 at %, respectively, based on 100 at % of the total concentration of Hf, In, and Zn.

Due to the oxide semiconductor layer 17 having such Zn concentration gradient, an etch stop layer may not be formed, thereby simplifying the manufacturing processes of the thin film transistor. Optionally, the etch stop layer (not shown) may be formed on the oxide semiconductor layer 17 as an insulating layer.

Figure 3D:
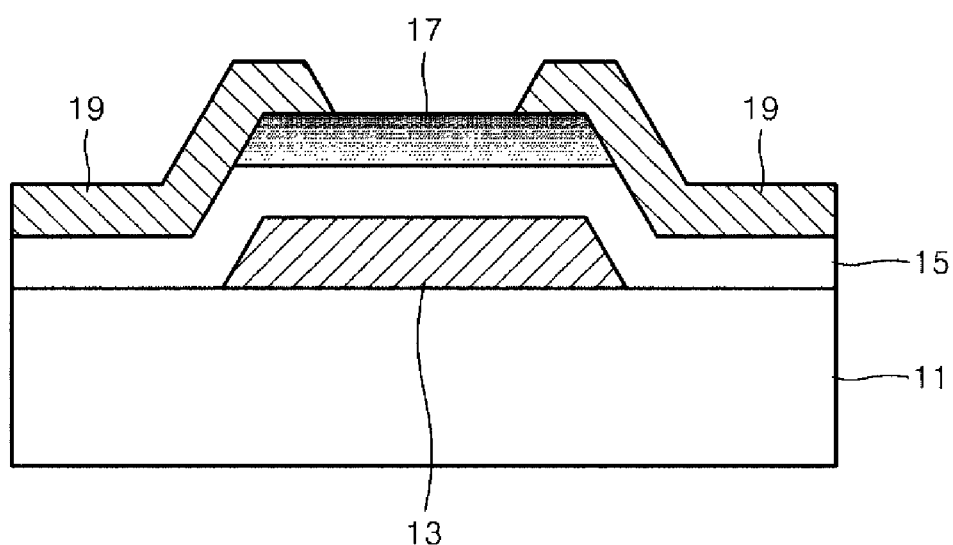

Referring to FIG. 3D, a conductive layer comprising a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the oxide semiconductor layer 17 and the gate insulating layer 15. The conductive layer comprising a metal or a conductive oxide is patterned to form the source and drain 19 extending on both sides of the oxide semiconductor layer 17 and the gate insulating layer 15.

FIGS. 4A through 4D are cross-sectional views sequentially illustrating a method of manufacturing a thin film transistor, according to another embodiment. The method of manufacturing a thin film transistor of FIGS. 4A through 4D is the same as the method of manufacturing a thin film transistor of FIGS. 3A through 3D, except that the oxide semiconductor layer is double-layered in the present embodiment.

Figure 4A:
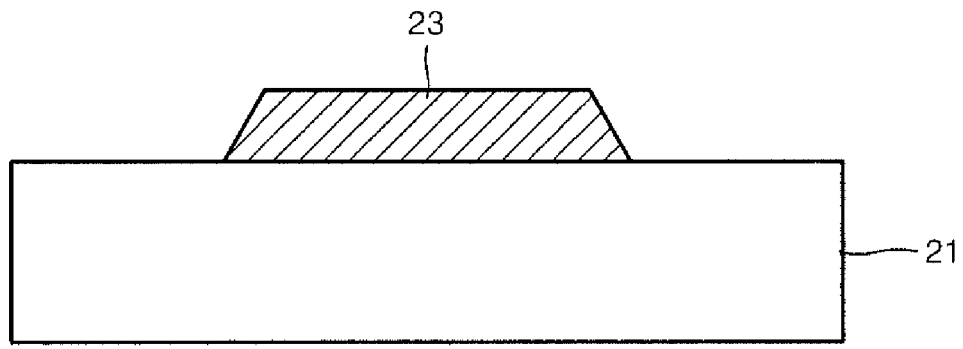
FIGS. 4A through 4D are cross-sectional views sequentially illustrating a method of manufacturing a thin film transistor, according to another embodiment.

Referring to FIG. 4A, the gate electrode 23 is formed on the substrate 21. The substrate 21 may comprise, for example, Si, glass, or plastic.

A conductive layer comprising a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the substrate 21, and patterned to form the gate electrode 23. Optionally, a buffer layer (not shown) is formed on the substrate 21, and the gate electrode 23 may be then formed thereon.

Figure 4B:
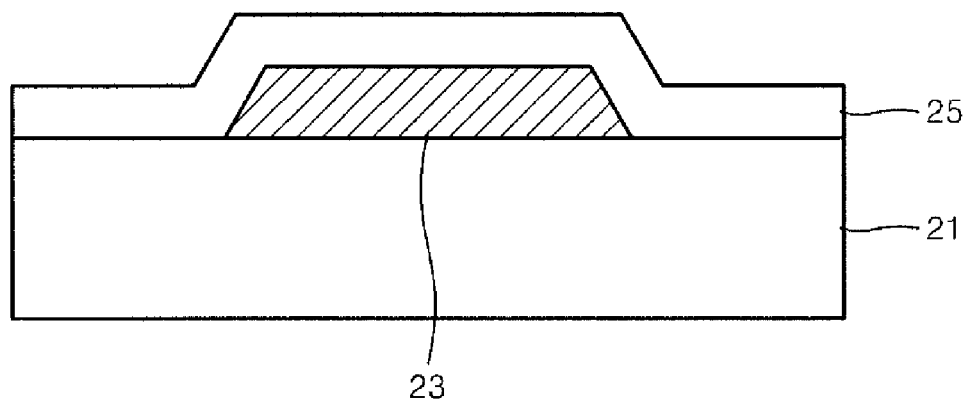

Referring to FIG. 4B, the gate insulating layer 25 is formed on the substrate 21 on which the gate electrode 23 is formed. The gate insulating layer 25 comprises a dielectric material such as $SiO_2$, $SiN_X$, SiON, $HfO_2$, $Al_2O_3$, $Y_2O_3$, or $Ta_2O_5$, a high-K dielectric material, or mixtures thereof.

Figure 4C:
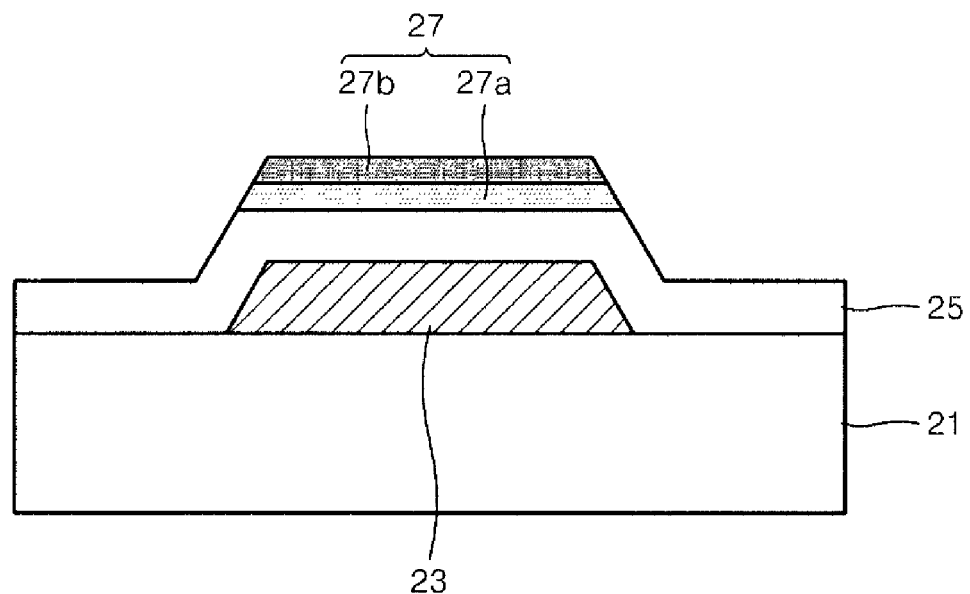

Referring to FIG. 4C, an HfInZnO-based oxide semiconductor layer is formed on the gate insulating layer 25, and patterned to form the oxide semiconductor layer 27. The oxide semiconductor layer 27 includes a first oxide semiconductor layer 27a formed on the gate insulating layer 25 and a second oxide semiconductor layer 27b formed on the first oxide semiconductor layer 27a. The concentration of Zn is higher in the second oxide semiconductor layer 27b than in the first oxide semiconductor layer 27a. For example, the first oxide semiconductor layer 27a and the second oxide semiconductor layer 27b may be formed in such a way that an atomic ratio of Zn to In is smaller than 1 (Zn/In<1) in the first oxide semiconductor layer 27a, and an atomic ratio of Zn to In is greater than 1 (Zn/In>1) in the second oxide semiconductor layer 27b. The concentration of Zn in the first oxide semiconductor layer 27a may be from about 30 to about 70 at % based on 100 at % of the total concentration of Hf, In, and Zn, and the concentration of Zn in the second oxide semiconductor layer 27b may be from about 35 to about 70 at % based on 100 at % of the total concentration of Hf, In, and Zn. When Zn/In<1, Zn/In=1, and Zn/In>1, the concentration of Hf (atomic percentage) may be from about 5 to about 13 at %, from about 3 to about 10 at %, and from about 2 to about 10 at %, respectively, based on 100 at % of the total concentration of Hf, In, and Zn. The HfInZnO-based oxide semiconductor may be amorphous or crystalline.

The first oxide semiconductor layer 27a and the second oxide semiconductor layer 27b may be respectively formed using targets having different compositions. The first oxide semiconductor layer 27a may be formed using a target for manufacturing an HfInZnO-based oxide semiconductor, wherein the concentration of Zn (Zn/In<1) in the target is low, and the second oxide semiconductor layer 27b may be formed using a target for manufacturing an HfInZnO-based oxide semiconductor, wherein the concentration of Zn in the target is high (Zn/In>1). Each of the first oxide semiconductor layer 27a and the second oxide semiconductor layer 27b may be amorphous or crystalline.

Optionally, an etch stop layer (not shown) may be formed on the second oxide semiconductor layer 27b.

Alternatively, the oxide semiconductor layer 27 may be three-layered using three targets having different concentration compositions of Zn. The concentration of Zn may be the lowest in a first oxide semiconductor layer formed right on the gate insulating layer 25, the concentration of Zn may be the highest in a third oxide semiconductor layer formed on the uppermost portion thereof, and the concentration of Zn may have a value between the highest and lowest values in a second oxide semiconductor layer formed therebetween.

Figure 4D:
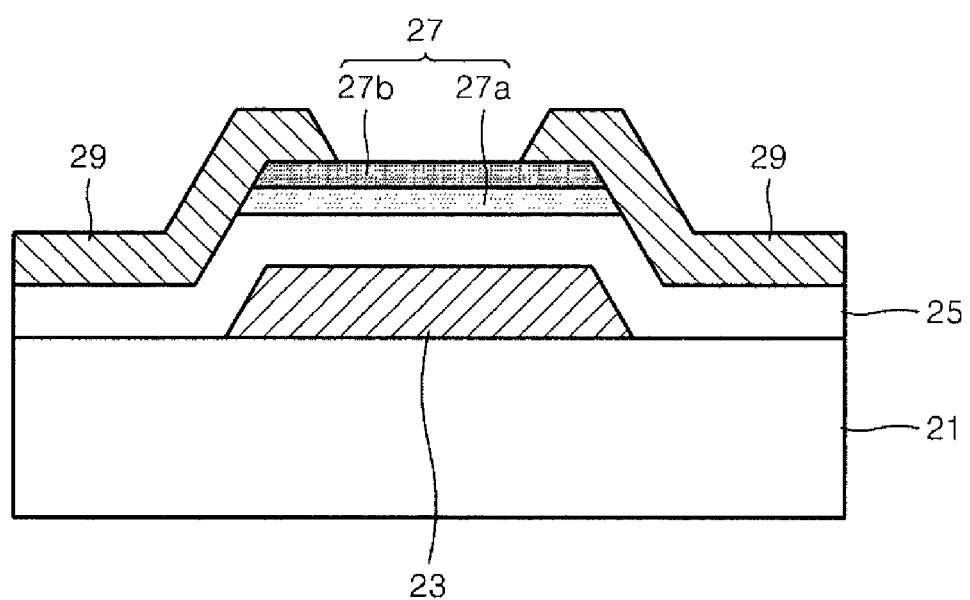

Referring to FIG. 4D, a conductive layer comprising a metal such as Ti, Pt, Ru, Cu, Au, Ag, Mo, Cr, Al, Ta, W, or alloys thereof, or a conductive oxide such as tin oxide, zinc oxide, indium oxide, ITO, IZO, GZO, IGO, or AZO is formed on the oxide semiconductor layer 27 and the gate insulating layer 25. The conductive layer comprising a metal or a conductive oxide is patterned to form the source and drain 29 extending on both sides of the oxide semiconductor layer 27 and the gate insulating layer 25.

Figure 6:
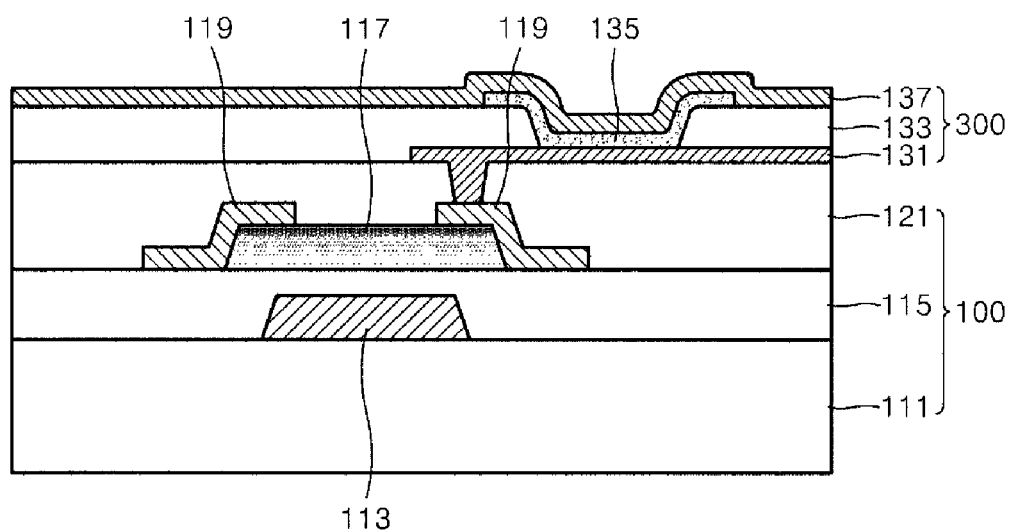
FIG. 6 is a cross-sectional view of an organic electroluminescent device including a thin film transistor, according to an embodiment.

FIG. 6 is a cross-sectional view of an organic electroluminescent device 300 including a thin film transistor, according to an embodiment.

Referring to FIG. 6, the organic electroluminescent device 300 includes an anode 131, a cathode 137, and an organic thin film layer 135 disposed between the anode 131 and the cathode 137. The organic thin film layer 135 may have a stacked structure including a hole transport layer, an organic emission layer, and an electron transport layer. The organic thin film layer 135 may further include a hole injection layer and an electron injection layer.

A thin film transistor 100 for controlling the operation of the organic electroluminescent device 300 has such structure of the HfInZnO-based oxide semiconductor thin film transistor as described above. The thin film transistor 100 includes: a substrate 111; a gate electrode 113 formed on the substrate 111; an HfInZnO-based oxide semiconductor layer 117 formed on the gate insulating layer 115 to correspond to the gate electrode 113; and source and drain 119 respectively formed on both sides of the HfInZnO-based oxide semiconductor layer 117.

The concentration of Zn may increase towards an upper portion of the HfInZnO-based oxide semiconductor layer 117 away from a lower portion of the HfInZnO-based oxide semiconductor layer 117. Optionally, the HfInZnO-based oxide semiconductor layer 117 may have a stacked structure in which the concentration of Zn is higher in an upper layer of the HfInZnO-based oxide semiconductor layer 117 than in a lower layer of the HfInZnO-based oxide semiconductor layer 117.

The anode 131 is electrically connected to any one of the source and drain 119. The organic electroluminescent device 300 may further include a capacitor for maintaining a signal. Hereinafter, one or more embodiments will be described in detail with reference to the following examples. However, these examples are not intended to limit the purpose and scope of the one or more embodiments.

EXAMPLE 1

Measurement of Characteristics and Stability of HfInZnO-Based Oxide Semiconductor Thin Film Transistor (TFT)

A gate electrode comprising Mo was formed on a glass substrate to have a thickness of 1000 Å, a width of 150 nm, and a length of 1000 nm, and a gate insulating layer comprising $SiN_x$ and $SiO_x$ was formed on the glass substrate and the gate electrode to have thicknesses of 400 Å and 800 Å, respectively. An HfInZnO-based oxide semiconductor layer was formed on the gate insulating layer to have a thickness of 300 to 500 Å.

The HfInZnO-based oxide semiconductor layer was formed by co-sputtering by respectively applying powers to three targets of $HfO_2$, $In_2O_3$, and ZnO in a sputter chamber and then patterned.

Subsequently, $In_2O_3$ was formed on the HfInZnO-based oxide semiconductor layer to have a thickness of 1000Å and patterned to form source/drain regions extending on both sides of the HfInZnO-based oxide semiconductor layer and the substrate.

During the formation of the HfInZnO-based oxide semiconductor layer, the concentration (at %) of Zn in the HfInZnO-based oxide semiconductor layer was varied by adjusting the voltages respectively applied to the targets. The electrical characteristics of a thin film transistor including an oxide semiconductor layer having different Zn concentration compositions were measured.

Table 1 below shows measurement results of the characteristics and stability of the HfInZnO-based oxide semiconductor TFT according to the concentration of Zn when the concentration of Hf is 5 at %, and the measurement results of the characteristics and stability of the HfInZnO-based oxide semiconductor TFT of Table 1 are illustrated in a graph in FIG. 5.

Figure 5:
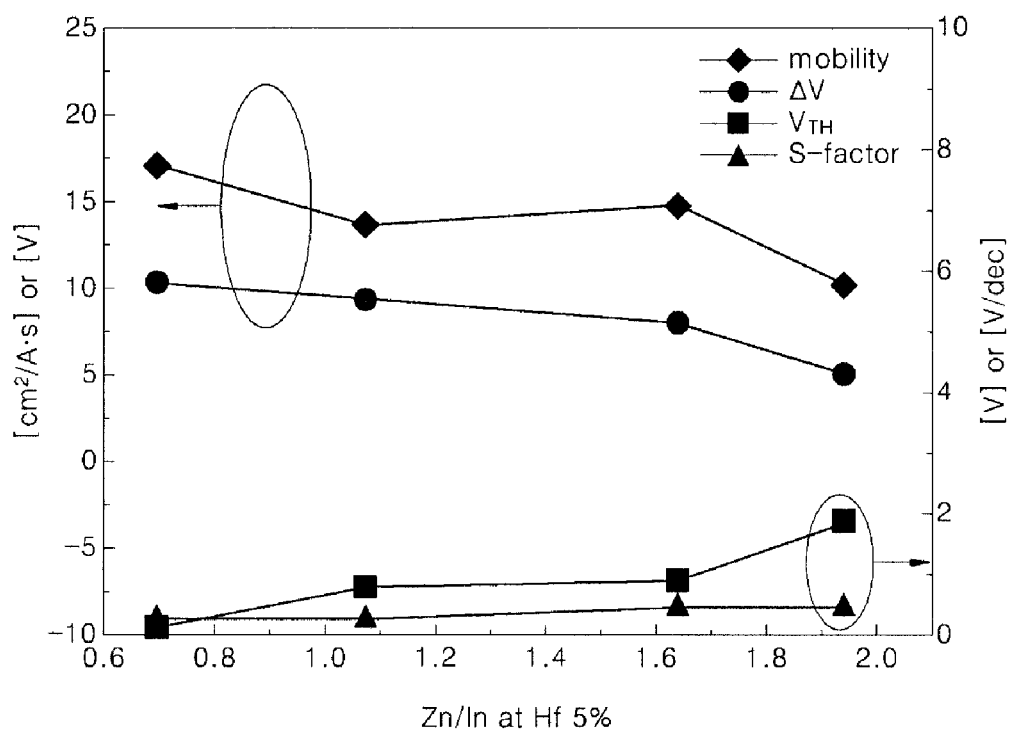
FIG. 5 is a graph showing measurement results of characteristics and stability of a HfInZnO-based oxide semiconductor thin film transistor according to the concentration of Zn, according to an embodiment.

In Table 1 and FIG. 5, Zn:In denotes an atomic ratio of Zn to In in the HfInZnO-based oxide semiconductor, Hf (at %) denotes the concentration (atomic percentage) of Hf in the HfInZnO-based oxide semiconductor, $V_{TH}$ (threshold voltage) denotes a minimum voltage for forming a channel in a transistor so as to allow current flow, and mobility denotes an average velocity of a carrier (electron) in the HfInZnO-based oxide semiconductor. ΔV denotes a change of threshold voltage $V_{TH}$ before and after the HfInZnO-based oxide semiconductor is under DC stress, and the DC stress denotes a change of $V_{TH}$ (ΔV$_{TH}$) when a gate bias of ±5 V is applied to the HfInZnO-based oxide semiconductor for 1 hour.

TABLE 1

| Zn:In | Hf (at %) | $V_{TH}$ (V) | Mobility ($cm^2/V \cdot s$) | ΔV (V) |
|---|---|---|---|---|
| 38:55 (0.69) | 5.0 | 0.08 | 16.96 | 10.1 |
| 46:43 (1.06) | 5.0 | 0.86 | 12.81 | 9.4 |
| 59:36 (1.69) | 4.6 | 0.94 | 14.69 | 8.1 |
| 62:36 (1.94) | 5.5 | 1.91 | 10.03 | 5.1 |

Referring to Table 1 and FIG. 5, the atomic ratio of Zn to In in the HfInZnO-based oxide semiconductor varies from 0.69, to 1.04, to 1.69, and to 1.94, and the concentration of Hf is constantly equal to about 5 at %. In this case, as the atomic ratio of Zn to In in the HfInZnO-based oxide semiconductor layer increases, the threshold voltage ($V_{TH}$) increases, the mobility of the HfInZnO-based oxide semiconductor decreases, and the ΔV decreases. As the atomic ratio of Zn to In increases, the electrical characteristics of the HfInZnO-based oxide semiconductor, such as threshold voltage and mobility are deteriorated, and the stability of the HfInZnO-based oxide semiconductor TFT, such as the change of the threshold voltage is enhanced.

The mobility of the HfInZnO-based oxide semiconductor is larger when the atomic ratio of Zn to In is 59:36 (1.69) than when the atomic ratio of Zn to In is 46:43 (1.06), because the concentration of Hf in the atomic ratio of Zn to In of 59:36 (1.69), e.g., 4.6 at % is smaller than the concentration of Hf in the atomic ratio of Zn to In of 46:43 (1.06), e.g., 5.0 at %.

Table 2 below shows measurement results of the characteristics and stability of the HfInZnO-based oxide semiconductor TFT when the concentration of Hf (atomic percentage) is about 7 at %, Zn=In, and Zn>In, Table 3 below shows measurement results of the characteristics and stability of the HfInZnO-based oxide semiconductor TFT when the concentration of Hf is about 8 at %, Zn<In, and Zn>In, and Table 4 below shows measurement results of the characteristics and stability of the HfInZnO-based oxide semiconductor TFT when the concentration of Hf is about 10 at %, Zn<In, and Zn=In.

TABLE 2

| Zn:In | Hf (at %) | $V_{TH}$ (V) | Mobility ($cm^2/V \cdot s$) | ΔV (V) |
|---|---|---|---|---|
| 48:45 (1.07) | 6.8 | 2.43 | 10.78 | 6.2 |
| 54:39 (1.38) | 6.7 | 2.45 | 8.11 | 3.8 |

TABLE 3

| Zn:In | Hf (at %) | $V_{TH}$ (V) | Mobility ($cm^2/V \cdot s$) | ΔV (V) |
|---|---|---|---|---|
| 38:55 (0.69) | 7.8 | 1.91 | 11.94 | 9.4 |
| 62:30 (2.07) | 7.8 | 4.59 | 5.95 | 4.1 |

TABLE 4

| Zn:In | Hf (at %) | $V_{TH}$ (V) | Mobility ($cm^2/V \cdot s$) | ΔV (V) |
|---|---|---|---|---|
| 35:54 (0.65) | 11.0 | 1.95 | 6.70 | 5.1 |
| 46:43 (1.07) | 10.0 | 5.81 | 2.13 | 4.2 |

Referring to Tables 2, 3, and 4, where the concentration of Hf is 5 at %, as the atomic ratio of Zn to In increases, the threshold voltage $V_{TH}$ increases, and the change of the threshold voltage $V_{TH}$ further increases as the concentration of Hf increases. In addition, as the atomic ratio of Zn to In increases, the mobility of the HfInZnO-based oxide semiconductor decreases. The change of the threshold voltage $V_{TH}$ (ΔV) increases as the atomic ratio of Zn to In increases, and it decreases as the atomic ratio of Zn to In decreases.

The results shown in Tables 1 through 5 show that when the atomic ratio of Zn to In increases, e.g., when the concentration of Zn increases, the electrical characteristics of the HfInZnO-based oxide semiconductor, such as threshold voltage or mobility are deteriorated, while the stability of the HfInZnO-based oxide semiconductor TFT such as the change of the threshold voltage is enhanced.

The results described above also show that when the HfInZnO-based oxide semiconductor layer has a gradual Zn concentration gradient in such a way that the concentration of Zn decreases towards a lower portion of the HfInZnO-based oxide semiconductor layer that contacts the gate insulating layer, and the concentration of Zn increases towards an upper portion of the HfInZnO-based oxide semiconductor layer that is subjected to subsequent processes, both the electrical characteristics and stability of the HfInZnO-based oxide semiconductor thin film transistor may be enhanced.

In the aforementioned embodiments, bottom-gate inverted-staggered TFTs and methods of manufacturing the same are described, but the present embodiments are not limited thereto. For example, the TFT according to an embodiment may be a bottom-gate coplanar-type TFT.

As described above, according to the one or more of the above embodiments, a HfInZnO-based oxide semiconductor layer has a Zn concentration gradient or has a stacked structure in which each layer has different Zn concentration, thereby enhancing the electrical characteristics of the HfInZnO-based oxide semiconductor layer as a channel layer and strengthening a portion of the HfInZnO-based oxide semiconductor layer that is exposed to the external agents. As a result, the stability of the HfInZnO-based oxide semiconductor TFT may be enhanced.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing a thin film transistor, the method comprising:
   forming a gate electrode on a substrate;
   forming a gate insulating layer on the gate electrode and exposed portions of the substrate;
   forming an HfInZnO-based oxide semiconductor layer having a Zn concentration gradient on the gate insulating layer; and
   forming source and drain regions respectively extending on both sides of the oxide semiconductor layer and the gate insulating layer.

2. The method of claim 1, wherein the forming of the oxide semiconductor layer is performed by co-sputtering by respectively applying powers to three targets of $HfO_2$, $In_2O_3$, and ZnO.

3. The method of claim 1, wherein the forming of the oxide semiconductor layer is performed in such a way that the concentration of Zn gradually increases towards an upper portion of the oxide semiconductor layer away from a lower portion of the oxide semiconductor layer.

4. The method of claim 1, wherein the forming of the oxide semiconductor layer is performed in such a way that concentration of Zn in the oxide semiconductor layer is from about 30 to about 70 at %.

5. The method of claim 1, wherein the oxide semiconductor layer is amorphous.

6. The method of claim 1, wherein the oxide semiconductor layer is crystalline.

7. The method of claim 1, further comprising forming a buffer layer between the substrate and the gate electrode.

8. The method of claim 1, further comprising forming an etch stop layer on the oxide semiconductor layer.

9. A method of manufacturing a thin film transistor, the method comprising:
   forming a gate electrode on a substrate;
   forming a gate insulating layer on the gate electrode and exposed portions of he substrate;
   forming an HfInZnO-based oxide semiconductor layer comprising a first layer formed on the gate insulating layer and a second layer formed on the first layer, wherein the concentration of Zn is higher in the second layer than in the first layer; and
   forming source and drain regions extending on both sides of the oxide semiconductor layer and the gate insulating layer.

10. The method of claim 9, wherein the forming of the oxide semiconductor layer is performed in such a way that the concentration of Zn in the first layer is from about 30 to about 70 at %, and the concentration of Zn in the second layer is from about 35 to about 70 at %.

11. The method of claim 9, wherein the oxide semiconductor layer is amorphous.

12. The method of claim 9, wherein the oxide semiconductor layer is crystalline.

13. The method of claim 9, further comprising forming a buffer layer between the substrate and the gate electrode.

14. The method of claim 9, further comprising forming an etch stop layer on the oxide semiconductor layer.

15. A thin film transistor comprising:
   a substrate;
   a gate electrode formed on the substrate;
   a gate insulating layer formed on the gate electrode and exposed portions of the substrate;
   an oxide semiconductor layer formed on the gate insulating layer and comprising an HfInZnO-based oxide semiconductor, wherein the oxide semiconductor layer has a Zn concentration gradient; and
   source and drain regions respectively formed on both sides of the oxide semiconductor layer and the gate insulating layer.

16. The thin film transistor of claim 15, wherein the concentration of Zn gradually increases towards an upper portion of the oxide semiconductor layer away from a lower portion of the oxide semiconductor layer.

17. The thin film transistor of claim 15, wherein the concentration of Zn in the oxide semiconductor layer is from about 30 to about 70 at % based on 100 at % of the total concentration of Hf, In, and Zn.

18. The thin film transistor of claim 15, wherein the oxide semiconductor layer is amorphous.

19. The thin film transistor of claim 15, wherein the oxide semiconductor layer is crystalline.

20. The thin film transistor of claim 15, further comprising a buffer ayer formed between the substrate and the gate electrode.

21. The thin film transistor of claim 15, further comprising an etch stop layer formed on the oxide semiconductor layer.

22. A thin film transistor comprising:
   a substrate;
   a gate electrode formed on the substrate;
   a gate insulating layer formed on the gate electrode and exposed portions of the substrate;
   an oxide semiconductor layer formed on the gate insulating layer comprising a first layer formed on the gate insulating layer and a second layer formed on the first layer, and comprising an HfInZnO-based oxide semiconductor, wherein the concentration of Zn is higher in the second layer than in the first layer; and
   source and drain regions respectively formed on both sides of the oxide semiconductor layer and the gate insulating layer.

23. The thin film transistor of claim 22, wherein the concentration of Zn in the first layer is from about 30 to about 70 at %, and the concentration of Zn in the second layer is from about 35 to about 70 at %.

24. The thin film transistor of claim 22, wherein the concentration of Hf in the oxide semiconductor layer is from about 2 to about 13 at %.

25. The thin film transistor of claim 22, wherein the oxide semiconductor layer is amorphous.

26. The thin film transistor of claim 22, wherein the oxide semiconductor layer is crystalline.

27. The thin film transistor of claim 22, further comprising a buffer layer formed between the substrate and the gate electrode.

28. The thin film transistor of claim 22, further comprising an etch stop layer formed on the oxide semiconductor layer.

* * * * *